(12) United States Patent
Yoshimochi (10) Patent No.: US 7,276,772 B2
(45) Date of Patent: Oct. 2, 2007

(54) SEMICONDUCTOR DEVICE

(75) Inventor: Kenichi Yoshimochi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/713,600

(22) Filed: Mar. 5, 2007

(65) Prior Publication Data

US 2007/0152274 A1 Jul. 5, 2007

Related U.S. Application Data

(62) Division of application No. 11/000,893, filed on Dec. 2, 2004, now Pat. No. 7,205,628.

(30) Foreign Application Priority Data

Dec. 12, 2003 (JP) .............................. 2003-415329

(51) Int. Cl.
*H01L 29/06* (2006.01)
(52) U.S. Cl. .................. 257/490; 257/544; 257/373; 257/242; 257/E29.005; 257/E29.012
(58) Field of Classification Search .......... 257/490, 257/544, 373, 242, E29.005, E29.012
See application file for complete search history.

(56) References Cited

U.S. PATENT DOCUMENTS 3,312,882 A * 4/1967 Pollock ..................... 257/500
3,788,253 A * 1/1974 Rickettson ................ 112/402
5,043,779 A * 8/1991 Nishimura ................. 257/339
5,444,291 A * 8/1995 Paparo et al. ............. 257/552
5,998,836 A 12/1999 Williams
6,734,494 B2 * 5/2004 Ohtani ...................... 257/330
6,828,626 B2 * 12/2004 Oikawa et al. ............ 257/330

FOREIGN PATENT DOCUMENTS

JP          2988871         10/1999

* cited by examiner

*Primary Examiner*—Evan Pert
*Assistant Examiner*—Victor A. Mandala, Jr.
(74) *Attorney, Agent, or Firm*—Rabin & Berdo, PC (57) ABSTRACT

A semiconductor device, including: a semiconductor substrate of a first conduction type; an active region used as a function-element-forming region on the semiconductor substrate; a low-resistance region of a second conduction type formed on an outermost periphery of the active region to surround the active region and having contact with the semiconductor substrate, the second conduction type being different from the first conduction type; and an electrode connected to the function element and the low-resistance region. A diode is formed by the semiconductor substrate and the low-resistance region. The function element and the diode are electrically connected in parallel between the semiconductor substrate and the electrode, and, between the semiconductor substrate and the electrode, resistance of the low-resistance region is lower than resistance of an electrical conduction path via the function element.

4 Claims, 7 Drawing Sheets

FIG. 7
PRIOR ART ably break. Even when the
SEMICONDUCTOR DEVICE

BACKGROUND OF THE INVENTION

1. Field of the Invention

The present invention relates to a semiconductor device in which function elements, such as MOS FETs (Metal Oxide Semiconductor Field Effect Transistors) and IGBTs (Insulated Gate Bipolar Transistors), are formed, and more particularly to a semiconductor device in which power elements are formed.

2. Description of Related Art

Figure 6:
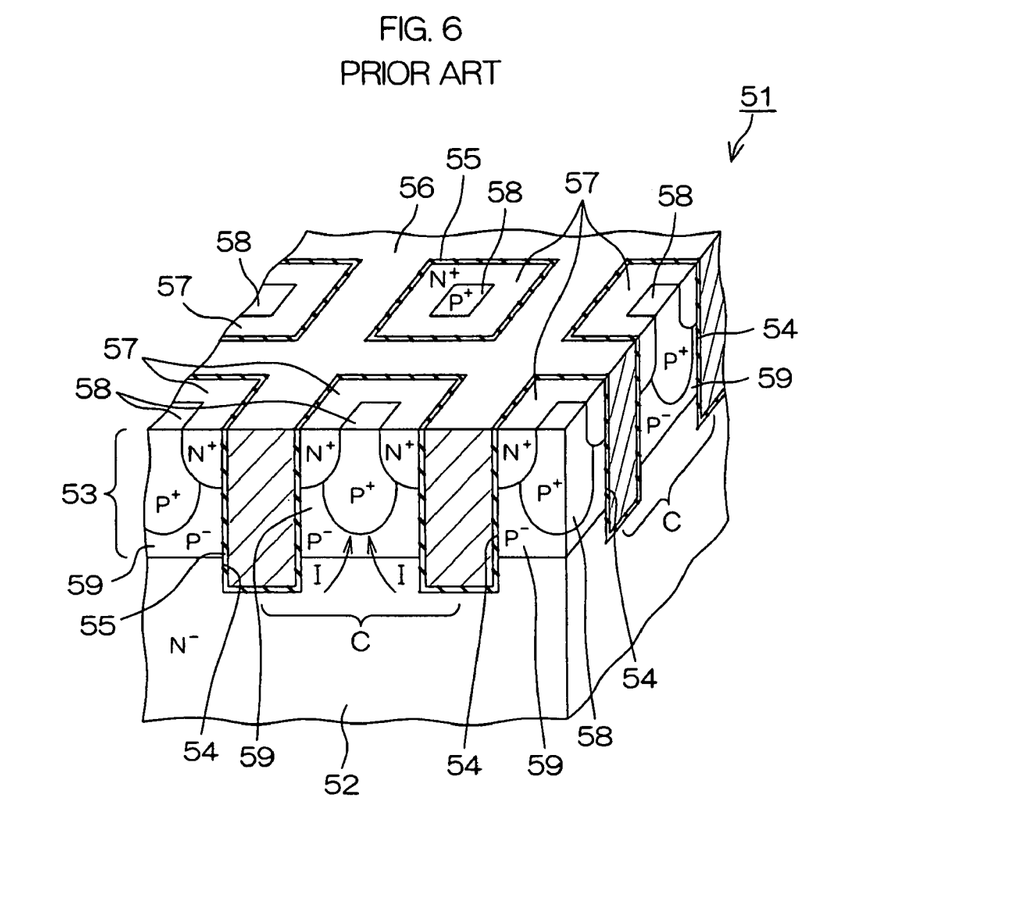
FIG. 6 is a perspective view schematically showing a partly cutaway semiconductor device in the prior art in which MOS FETs are formed.

FIG. 6 is a perspective view schematically showing a partly cutaway semiconductor device in the prior art in which MOS FETs are formed.

A semiconductor layer 53 is formed on an $N^-$-type region (drain region) 52 formed on one surface of a semiconductor substrate (not shown). A trench 54 is formed to penetrate through the semiconductor layer 53 and reach the surface layer portion of the $N^-$-type region 52. The trench 54 includes a plurality of trenches which are parallel to the semiconductor substrate and extend in two directions intersecting with each other at right angles.

An oxide film 55 is formed along the inner surface of the trench 54. The interior of the trench 54 is filled with a gate electrode 56 made of polysilicon doped with impurities to be electrically conductive (to lower resistance). The semiconductor layer 53 is divided into a plurality of regions by the trench 54, and cells C, each including a single function element (MOS FET), are fabricated from the semiconductor layer 53 divided by the trench 54, and the oxide film 55 and the gate electrode 56 on the periphery.

The semiconductor layer 53 in each cell C includes an $N^+$-type region (source region) 57 formed along the edge of the trench 54, a $P^+$-type base region 58 formed in a region surrounded by the $N^+$-type region 57, and a $P^-$-type region 59 placed between the $N^+$-type region 52 and the $N^+$-type region 57 as well as the base region 58. The base region 58 is doped with impurities at a higher concentration than the other semiconductor portions and thereby has lower resistance.

The base region 58 is formed from the surface of the semiconductor layer 53 to a region deeper than the $N^+$-type region 57. This configuration makes an interval between the base region 58 and the $N^-$-type region 52 narrower than an interval between the $N^+$-type region 57 and the $N^-$-type region 52.

On the semiconductor layer 53 is provided an unillustrated source electrode that is electrically connected to the $N^+$-type region 57 and the base region 58. The source electrode and the gate electrode 56 are electrically isolated by an unillustrated silicon oxide film.

In the semiconductor device 51, for a current to flow between the $N^-$-type region 52 and the $N^+$-type region 57, a channel is formed in the $P^-$-type region 59 at a portion in close proximity to the interface to the oxide film 55 by applying a sufficiently large voltage between the $N^-$-type region 52 and the source electrode ($N^+$-type region 57) and setting the gate electrode 56 at adequate potential.

In a case where the semiconductor device 51 is used as a switching element, when the semiconductor device 51 is turned OFF, a fly-back voltage is generated due to wiring inductance of circuits including the semiconductor device 51, and a current (surge current) I resulted from the fly-back voltage flows through the low-resistance base region 58. Also, the presence of the base region 58 makes it difficult for a parasitic transistor, comprising the $N^-$-type region 52 as the collector, the $P^-$-type region 59 as the base, and the $N^+$-type region 57 as the emitter, to be switched ON.

This configuration can avoid an unwanted event that the MOS FETs (channel-forming regions in the $P^-$-type regions 59) break due to heat generation.

In a case where the base resistance of the $P^-$-type region 59 is high, however, the parasitic transistor is switched ON. A large current then flows through the $P^-$-type region 59 and the $P^-$-type region 59 may possibly break. Even when the parasitic transistor remains OFF, a current does not necessarily flow evenly through the base regions 58 in the respective cells C, and the current I concentrates in a base region 58 having the lowest resistance value. In this case, a large current flows between this particular base region 58 and the $N^-$-type region 52, and breaking occurs where the large current has flown.

Figure 7:
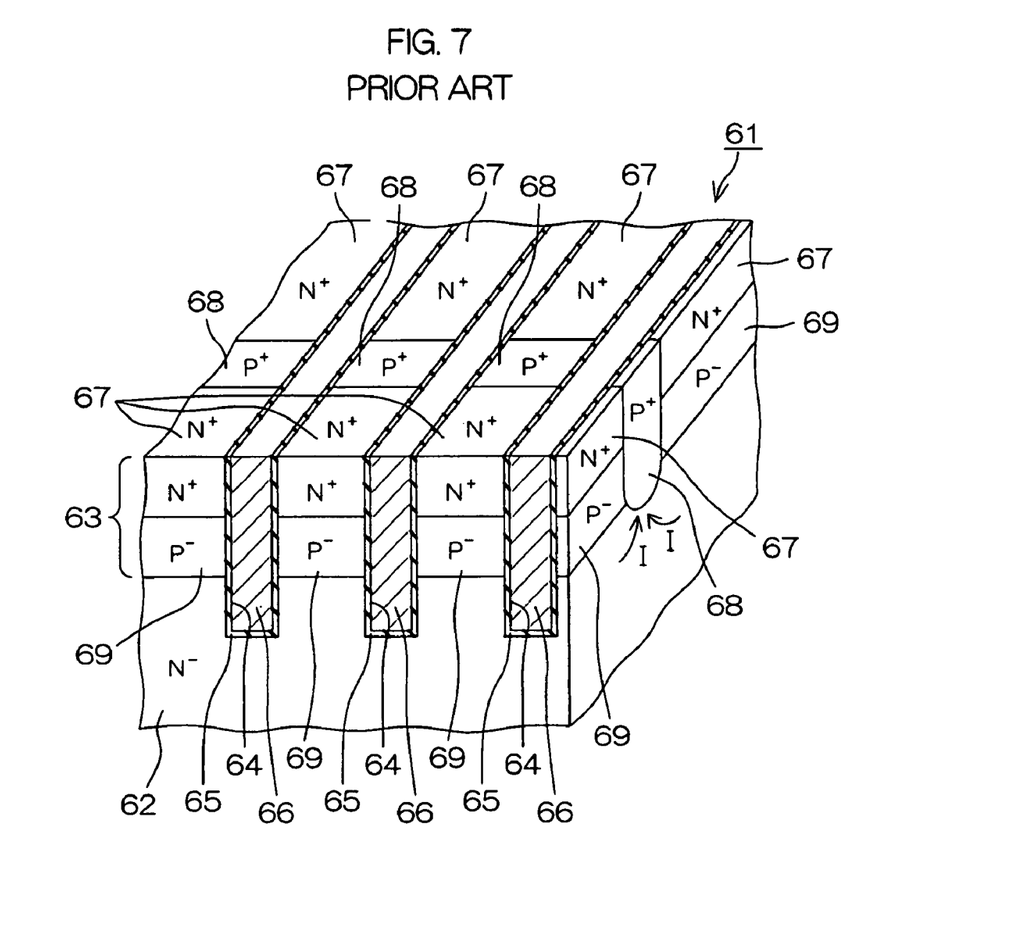
FIG. 7 is a perspective view schematically showing another partly cutaway semiconductor device in the prior art in which MOS FETs are formed.

FIG. 7 is a perspective view schematically showing another partly cutaway semiconductor device in the prior art in which MOS FETs are formed.

A semiconductor layer 63 is formed on an $N^-$-type region (drain region) 62 formed on one surface of a semiconductor substrate (not shown). The semiconductor layer 63 includes a $P^-$-type region 69 at the bottom (on the side closer to the $N^-$-type region 62) and an $N^+$-type region 67 at the top (on the side farther from the $N^-$-type region 62).

A plurality of trenches 64 are formed to penetrate through the semiconductor layer 63 and reach the surface layer portion of the $N^-$-type region 62. The semiconductor device 61 is of a so-called stripe structure, and the trenches 64 are formed stripe-wise along one direction within a plane parallel to the semiconductor substrate. The semiconductor layer 63 (the $P^-$-type region 69 and the $N^+$-type region 67) is thus divided (partitioned) to stripe-shaped regions extending in the same direction as the trenches 64.

An oxide film 65 is formed on the inner surface of each trench 64. The interior of the trench 64 is filled with a gate electrode 66 made of polysilicon doped with impurities to be electrically conductive (to lower resistance).

A base region 68, which is doped with P-type impurities at a high concentration, is formed in a direction within the plane parallel to the semiconductor substrate perpendicular to the length direction of the trenches 64. The base region 68 is formed from the surface of the semiconductor layer 63 to a region as deep as the surface layer portion of the $N^-$-type region 62. The base region 68 is formed in a region shallower than the depth of the trenches 64, and is partitioned into a plurality of regions by the trenches 64.

On the semiconductor layer 63 is formed an unillustrated source electrode that is electrically connected to the $N^+$-type region 67 and the base region 68. The source electrode and the gate electrodes 66 are electrically isolated by an unillustrated silicon oxide film.

In this semiconductor device 61, too, the current I resulted from the fly-back voltage flows through the low-resistance base region 68. However, because the base region 68 comprises a plurality of regions separated independently, when a large current concentrates in and flows through a base region 68 having the lowest resistance value, breaking occurs in the vicinity of this particular base region 68.

Apart from these semiconductor devices 51 and 61, there has been proposed a semiconductor device in which, in addition to the active cells (MOS FET cells) having the function elements formed inside, diode cells used to selectively flow a surge current are provided within the active region used as the region where the function elements, such as MOS FETs, are formed. Such a semiconductor device is disclosed, for example, in Japanese Patent No. 2988871. In this semiconductor device, one diode cell is provided for an adequate number (for example, eight) of active cells.

The diode cell includes a semiconductor layer (low-resistance region), which is doped with impurities at a high concentration and formed into a region deeper than the gate electrode in the active cell. This configuration allows a current to flow through the diode cell having a low resistance value when the fly-back voltage is applied to the semiconductor device, and the active cell is thereby protected.

However, a plurality of diode cells are placed discretely in the semiconductor device configured as described above, and a current concentrates in and flows through a diode cell having the lowest resistance value. Hence, there is a risk that breaking occurs in the vicinity of a diode cell having a small resistance value.

Even when a current does not concentrate in a particular diode cell, a large number of diode cells need to be provided within the active region for the current to be dispersed efficiently, which relatively lowers a ratio of the active cells that can be formed within the active region. Current-flowing regions (channel regions) per unit area while the semiconductor device stays ON are thus reduced, which in turn increases the ON-resistance.

SUMMARY OF THE INVENTION

It is therefore an object of the invention to provide a semiconductor device capable of improving the breaking withstand capability while reducing the ON-resistance.

A semiconductor device of the invention includes: a semiconductor substrate of a first conduction type; an active region used as a function-element-forming region on the semiconductor substrate; a low-resistance region of a second conduction type formed on an outermost periphery of the active region to surround the active region and having contact with the semiconductor substrate, the second conduction type being different from the first conduction type; and an electrode connected to the function element and the low-resistance region. A diode is formed by the semiconductor substrate and the low-resistance region. The function element and the diode are electrically connected in parallel between the semiconductor substrate and the electrode, and, between the semiconductor substrate and the electrode, resistance of the low-resistance region is lower than resistance of an electrical conduction path via the function element.

When a fly-back voltage is generated due to wiring inductance of the circuits including the semiconductor device, a current (surge current) resulted from the fly-back voltage flows between the semiconductor substrate and the electrode through the low-resistance region having lower resistance. Because the low-resistance region is formed to surround the active region, the current flows through the interface between the semiconductor substrate and the low-resistance region while being dispersed around the active region. In short, the current flows by being dispersed in a wide region without concentrating locally. Hence, when the fly-back voltage is applied, breaking hardly occurs in the low-resistance region, which can in turn prevent the surge current from being applied to the function element in the active region in a reliable manner. The breaking withstand capability of the semiconductor device can be thus improved.

Also, by providing the low-resistance region to surround the active region, a current can be dispersed more efficiently than in a case where, for example, the low-resistance region (diode cell) is provided within the active region alone. In short, given that the area of the low-resistance region is equal, then the higher breaking withstand capability can be achieved. In other words, an area of the low-resistance region needed to achieve the same breaking withstand capability can be smaller. It is thus possible to form a large number of function elements per unit area in the active region, which can in turn reduce the ON-resistance.

Further, because there is no need to form a base region used to flow the surge current inside the cell, significant miniaturization of the cell is enabled. Hence, the density of the function elements within the active region can be increased and the current-flowing regions (channel regions) per unit area within the active region can be increased, which can in turn reduce the ON-resistance further.

The semiconductor substrate may form part of the function element (for example, the drain region).

A well region of the second conduction type may further be formed on an outer periphery of the low-resistance region. In this case, a protection diode may be formed by the well region and the substrate, and the protection diode and the function element formed in the active region may be electrically connected in parallel between the semiconductor substrate and the electrode. Also, in this case, an impurity concentration in the well region may be higher than an impurity concentration in the active region at a portion of the second conduction type, and lower than an impurity concentration in the low-resistance region.

According to this configuration, even in the event of full depletion in the active region at the portion of the second conduction type when a voltage is applied to the function element and the protection diode, it is possible to maintain the well region in a state in which full depletion will not occur. In this case, when an applied voltage reaches or exceeds a certain magnitude, a current flows via the well region. The withstand voltage of the semiconductor device can be thus determined by the impurity concentration in the well region.

The low-resistance region is not necessarily formed to surround the active region completely (it may be partitioned).

However, it is preferable that the low-resistance region is formed continuously to surround the active region and is in contact with the semiconductor substrate on an entire circumference. According to this configuration, a current flows along the entire circumference of the low-resistance region in a nearly homogeneous distribution, which can in turn further improve the breaking withstand capability of the semiconductor device.

The low-resistance region may include an extension provided to extend into the active region. In other words, the low-resistance region may be provided not only to surround the active region, but also to extend into the active region. In this case, the low-resistance region that surrounds the active region, and the low-resistance region present within the active region may be provided continuously.

According to this configuration, a current flows almost evenly in this semiconductor device across the interface between the semiconductor substrate and the low-resistance region through the portion surrounding the active region and the extension. The current is thus allowed to flow while being dispersed more efficiently. It is preferable that the extension is in contact with the semiconductor substrate along its entire length.

The extension of the low-resistance region may be formed substantially parallel to a trench formed in the active region.

According to this configuration, even when the extension is formed in a region shallower than the bottom of the trench, the extension is not partitioned by the trench.

More than one trench may be formed, and in this case, the trenches may be formed in or almost in parallel with each other.

The extension may be connected to the low-resistance region surrounding the active region, for example, at the both ends.

More than one of the extension may be provided, and in this case, it is preferable that the plurality of extensions are formed at substantially regular intervals. According to this configuration, it is possible to flow a current evenly within the active region (the interfaces between the extensions and the semiconductor substrate).

The function element formed in the active region may be a MOS field effect transistor (MOS FET) or an insulated gate bipolar transistor (IGBT). In this case, it is possible to improve the breaking withstand capability of the semiconductor device (in particular, the semiconductor device serving as a power element) in which MOS FETs or IGBTs are formed.

In the MOS field effect transistor or the insulated gate bipolar transistor, a channel-forming region may be of the second conduction type, and in this case, the channel-forming region may be electrically connected to the low-resistance region.

According to this configuration, because the channel-forming region is electrically connected to the low-resistance region, a surge current flows more through the low-resistance region having lower resistance. It is thus possible to avoid an unwanted event that a large current flows through the cannel-forming region and breaking occurs in the region where the large current has flown.

The above and other objects, features, and advantages of the invention will become more apparent from the following description of embodiments with reference to the accompanying drawings.

DESCRIPTION OF THE PREFERRED EMBODIMENTS

Figure 1:
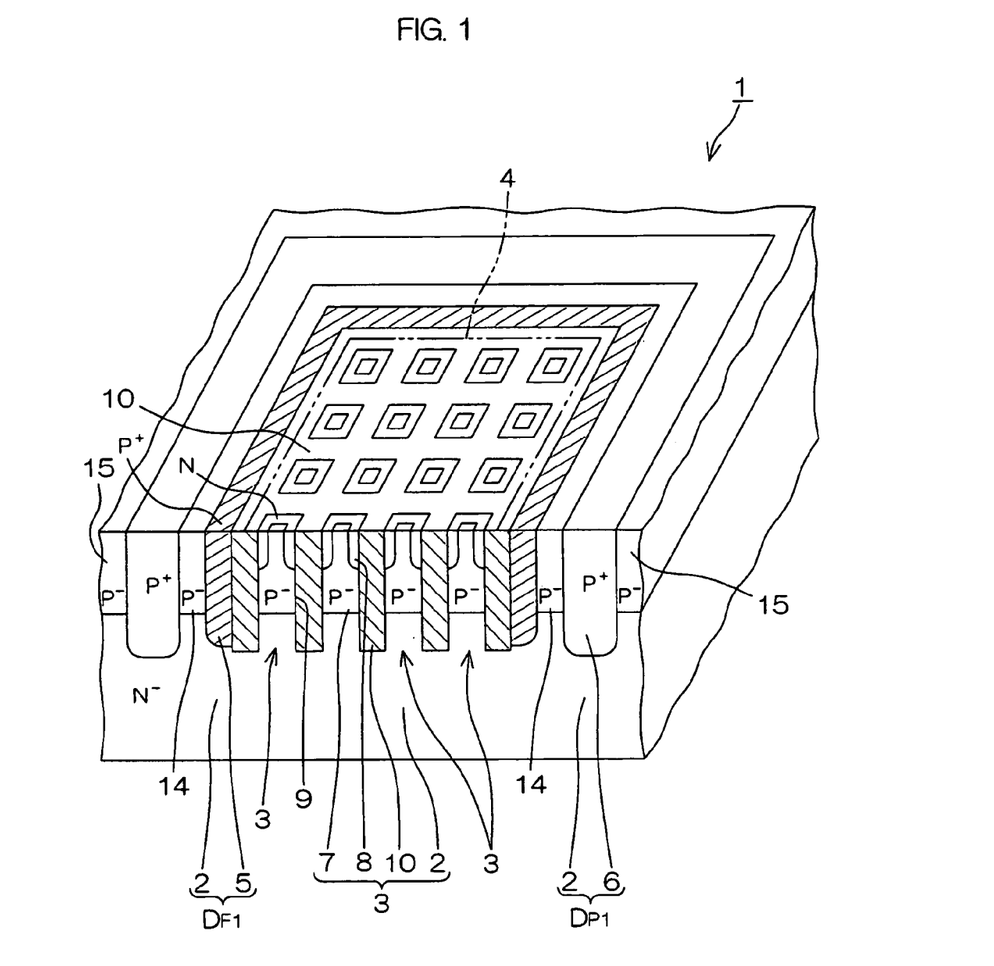
FIG. 1 is a perspective view schematically showing a partly cutaway semiconductor device according to a first embodiment of the invention.
Figure 2:
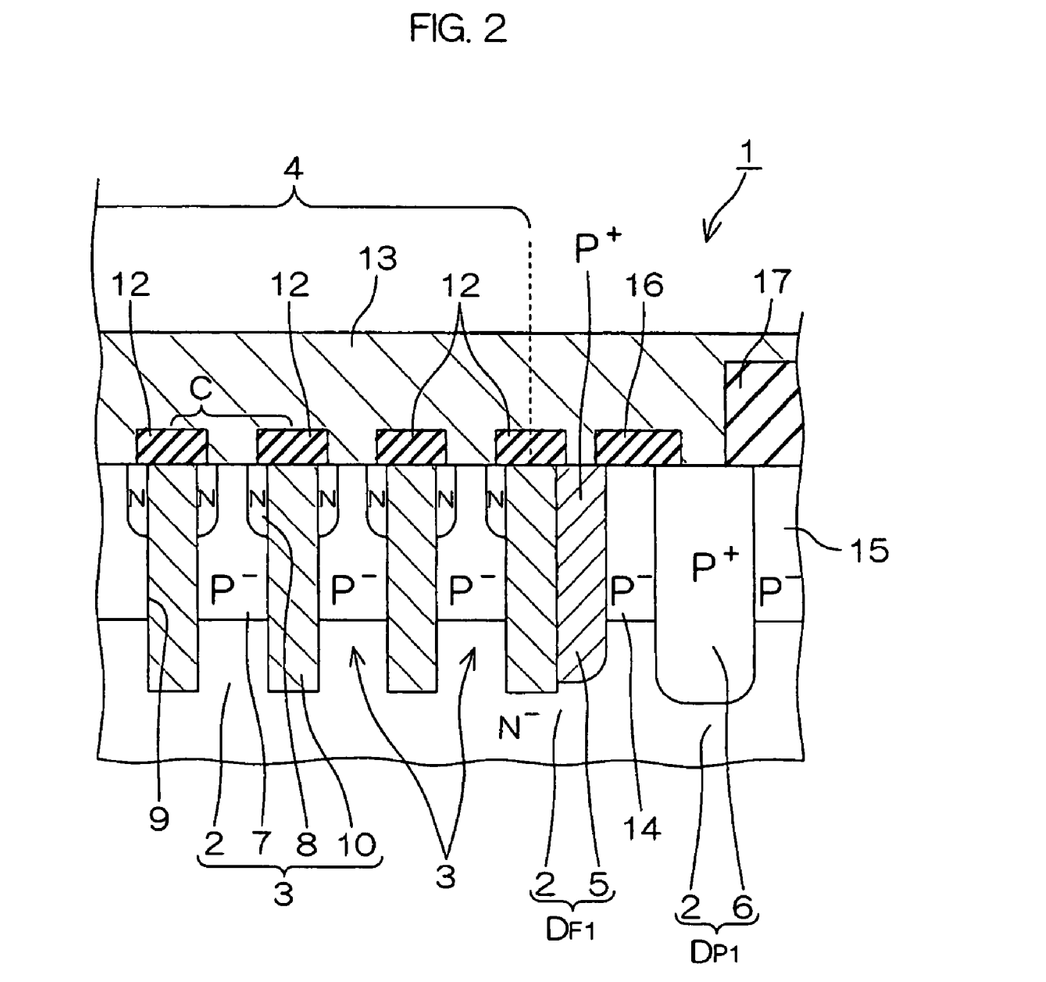
FIG. 2 is a cross section schematically showing the vicinity of a peripheral edge of the semiconductor device shown in FIG. 1.

FIG. 1 is a perspective view schematically showing a partly cutaway semiconductor device according to a first embodiment of the invention, and FIG. 2 is a cross section schematically showing the vicinity of a peripheral edge.

A semiconductor device 1 is of a field clamp diode structure, in which an active region 4 used as a function-element-forming region provided in the inner region and a $P^+$-type low-resistance region 5 formed on the outermost periphery of the active region 4 to surround the active region 4 are formed on an $N^-$-type silicon substrate 2. Referring to FIG. 1 and FIG. 2, of the semiconductor portions, the low-resistance region 5 and a gate electrode 10 alone are indicated by hatching.

The silicon substrate 2 may be provided with an epitaxial layer on the surface. In this case, the active region 4 and the low-resistance region 5 can be formed on the epitaxial layer.

In the active region 4 are formed a plurality of MOS FETs (Metal Oxide Semiconductor Field Effect Transistors) 3 as function elements. None of the MOS FETs 3 is formed on the outside of the region surrounded by the low-resistance region 5.

In the active region 4, a $P^-$-type region 7 is formed on the silicon substrate 2 forming the drain region, and a trench 9 is formed to penetrate through the $P^-$-type region 7 and reach the surface layer portion of the silicon substrate 2. The trench 9 includes a plurality of trenches which are parallel to the silicon substrate 2 and extend in two directions intersecting with each other at right angles. An N-type region 8 is formed on the edge portion of the trench 9 in the surface layer portion of the $P^-$-type region 7.

An oxide film (not shown) is formed along the inner surface of the trench 9. The interior of the trench 9 is filled with the gate electrode 10 made of polysilicon doped with impurities to be electrically conductive (to lower resistance).

The $P^-$-type region 7 and the N-type region 8 are divided by the trench 9 into a plurality of regions of a rectangular shape when viewed in a plane looking down the silicon substrate 2 perpendicularly. The $P^-$-type region 7 and the N-type region 8 divided by the trench 9 and the oxide film and the gate electrode 10 on the periphery constitute cells C (see FIG. 2), each including a single function element (MOS FET 3).

The low-resistance region 5 is formed into a region deeper than the $P^-$-type region 7. To be more specific, the interface between the low-resistance region 5 and the silicon substrate 2 is at a deeper position than the interface between the $P^-$-type region 7 and the silicon substrate 2 from the surface of the $P^-$-type region 7. The low-resistance region 5 is in contact with the silicon substrate 2 on the entire circumference, and forms a diode (hereinafter, referred to as the "field clamp diode") $D_{F1}$ together with the silicon substrate 2.

A well region 6 having $P^+$-type conduction is formed on the periphery of the low-resistance region 5. On the silicon substrate 2, $P^-$-type regions 14 and 15 are formed to come in contact with the well region 6, respectively, between the active region 4 and the well region 6 and on the outside periphery of the well region 6.

The impurity concentration in the low-resistance region 5 is set higher than in the $P^-$-type region 7 and the well region 6. Also, the impurity concentration in the well region 6 is lower than the impurity concentration in the low-resistance region 5, and higher than the impurity concentration in the $P^-$-type region 7.

The impurity concentration in the low-resistance region 5 is, for example, $5.0 \times 10^{19}$ atoms/cm$^3$ to $1.0 \times 10^{20}$ atoms/cm$^3$. In this case, the impurity concentration in the well region 6 is, for example, $5.0 \times 10^{18}$ atoms/cm$^3$ to $5.0 \times 10^{19}$ atoms/cm$^3$, and the impurity concentration in the P$^-$-type region 7 is, for example, $1.0 \times 10^{16}$ atoms/cm$^3$ to $1.0 \times 10^{17}$ atoms/cm$^3$.

A continuous source electrode 13 (not shown in FIG. 1) is formed on the P$^-$-type region 7, the N-type region 8, the low-resistance region 5, and the well region 6. The source electrode 13 is electrically connected to the P$^-$-type region 7, the N-type region 8, the low-resistance region 5, and the well region 6. Hence, the respective MOS FETs 3, the field clamp diode D$_{F1}$, and a diode (hereinafter, referred to as the "protection diode") D$_{P1}$, comprising the silicon substrate 2 and the well region 6, are electrically connected in parallel between the silicon substrate 2 and the source electrode 13. This configuration allows a voltage of the same magnitude to be applied concurrently to the MOS FETs 3, the field clamp diode D$_{F1}$, and the protection diode D$_{P1}$.

Due to the aforementioned relation in terms of impurity concentrations, between the silicon substrate 2 and the source electrode 13, the resistance of the low-resistance region 5 is lower than the resistances of the P$^-$-type region 7 and the well region 6. To be more specific, the resistance of an electrical conduction path from the silicon substrate 2 to the source electrode 13 via the low-resistance region 5 is lower than the resistance of an electrical conduction path from the silicon substrate 2 to the source electrode 13 via the P$^-$-type regions 7 in the MOS FETs 3, and the resistance of an electrical conduction path from the silicon substrate 2 to the source electrode 13 via the well region 6.

Because the impurity concentration in the well region 6 is higher than the impurity concentration in the P$^-$-type regions 7, even in the event of full depletion in the P$^-$-type region 7 when a voltage is applied to the MOS FETs 3, the field clamp diode D$_{F1}$, and the protection diode D$_{P1}$, it is possible to maintain the well region 6 in a state in which full depletion will not occur. In this case, when an applied voltage reaches or exceeds a certain magnitude, a current flows via the well region 6. The withstand voltage of the semiconductor device 1 is therefore determined by the well region 6 (protection diode D$_{P1}$).

The source electrode 13 is electrically isolated from the gate electrode 10 and the P$^-$-type regions 14 and 15 by silicon oxide layers 12, 16, and 17, respectively (see FIG. 2).

In the semiconductor device 1, for a current to flow between the silicon substrate 2 and the source electrode 13, a channel is formed in the P$^-$-type region 7 at a portion in close proximity to the interface to the oxide film (gate insulation film) formed on the inner surface of the trench 9 by applying a sufficiently large voltage between the silicon substrate 2 and the source electrode 13 while the gate electrode 10 is set at adequate potential.

In a case where the semiconductor device 1 is used as a switching element, when the semiconductor device 1 stays OFF, a fly-back voltage is generated due to wiring inductance of circuits including the semiconductor device 1, and the fly-back voltage is applied, concurrently in the same magnitude, to the MOS FETs 3, the field clamp diode D$_{F1}$, and the protection diode D$_{P1}$, which are connected in parallel. In this instance, a surge current flows between the silicon substrate 2 and the source electrode 13 through an electrical conduction path including the low-resistance region 5 (field clamp diode D$_{F1}$) having lower resistance.

Because the low-resistance region 5 is formed continuously to surround the active region 4, the surge current flows across the interface between the low-resistance region 5 and the silicon substrate 2 and flows through the entire circumference of the interface in nearly the same magnitude. That is to say, the surge current flows while being dispersed to the periphery of the active region 4, and the surge current, therefore, will never concentrate on one point to flow spot-wise.

The configuration described above makes it possible to avoid an unwanted event that the MOS FETs 3 (channel-forming regions in the P$^-$-type regions 7 or the like) or parts in the vicinity of the interface between the low-resistance region 5 and the silicon substrate 2 break due to spot-wise heat generation. In short, the breaking withstand capability of the semiconductor device 1 is high.

By adopting the field clamp diode structure in this manner, the surge current can be dispersed efficiently. Hence, in comparison with the semiconductor devices 51 and 61 (see FIG. 6 and FIG. 7, respectively) in the prior art in which the current I flows locally, a total area can be smaller for the low-resistance region 5 (base regions 58 and 68 or the diode cell) needed to achieve the predetermined breaking withstand capability. The function elements (MOS FETs 3) can thus account for a larger area on the silicon substrate 2 having a constant area.

Further, unlike the semiconductor device 51 in the prior art, the semiconductor device 1 omits from the cell C the base region 58 (see FIG. 6) used to form a path for the surge current resulted from the fly-back voltage to flow, which enables significant miniaturization of the cells C. The semiconductor device 1 is thus able to reduce the ON-resistance by increasing the channel-forming regions per unit area.

Figure 3:
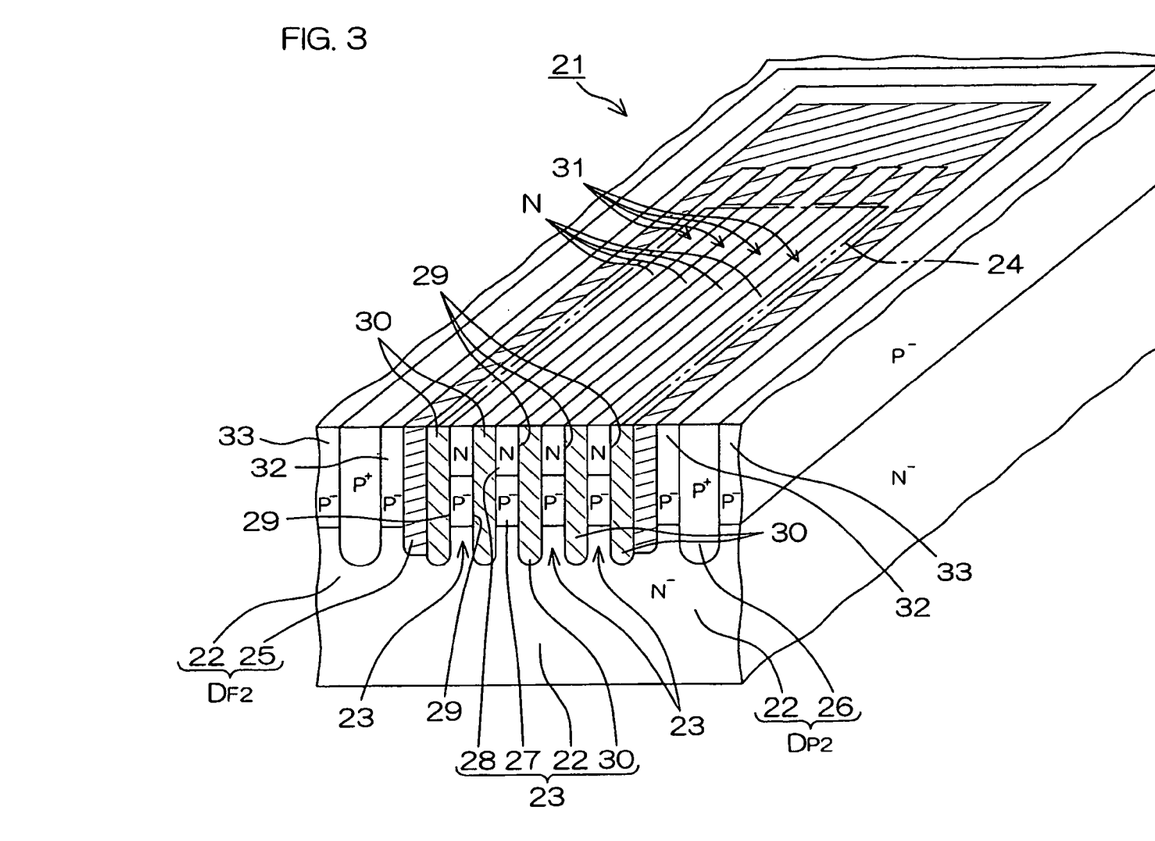
FIG. 3 is a perspective view schematically showing a partly cutaway semiconductor device according to a second embodiment of the invention.

FIG. 3 is a perspective view schematically showing a partly cutaway semiconductor device according to a second embodiment of the invention.

A semiconductor device 21 is of the field clamp diode structure, in which an active region 24 used as a function-element-forming region provided in the inner region and a low-resistance region 25 formed on the outermost periphery of the active region 24 to surround the active region 24 are formed on an N$^-$-type silicon substrate (drain region) 22. Referring to FIG. 3, of the semiconductor portions, the low-resistance region 25 and gate electrodes 30 alone are indicated by hatching.

The active region 24 is of nearly a rectangular shape when viewed in a plane looking down the silicon substrate 22 perpendicularly, and the low-resistance region 25 is formed to go along the four sides of the active region 24.

In the active region 24 are formed a plurality of MOS FETs 23 as function elements. None of the MOS FETs 23 is formed on the outside of the region surrounded by the low-resistance region 25.

In the active region 24, a P$^-$-type region 27 is formed on the silicon substrate 22. An N-type region 28 is formed on the P$^-$-type region 27. Also, a plurality of trenches 29 are formed to penetrate through the P$^-$-type region 27 and the N-type region 28 in the thickness direction and reach the surface layer portion of the silicon substrate 22.

The semiconductor device 21 is of a so-called stripe structure, and the plurality of trenches 29 are formed stripe-wise along one direction within a plane parallel to the silicon substrate 22. The N-type region 28, the P$^-$-type region 27, and the top portion of the silicon substrate 22 are divided into stripe-shaped regions (hereinafter, referred to as the "stripe regions") 31 extending in the same direction as the trenches 29.

An oxide film (not shown) is formed along the inner surface of each trench 29. The interior of the trench 29 is filled with the gate electrode 30 made of polysilicon doped with impurities to be electrically conductive (to lower resistance).

The low-resistance region 25 is formed from the surface of the N-type region 28 almost as deep as the bottoms of the trenches 29, that is, into a region deeper than the interface between the silicon substrate 22 and the P⁻-type region 27. The P⁻-type region 27 is electrically connected to the low resistance region 25 at the both ends in the length direction.

The low-resistance region 25 is in contact with the silicon substrate 22 on the entire circumference, and constitutes a diode (hereinafter, referred to as the "field clamp diode") $D_{F2}$ together with the silicon substrate 22.

On the periphery of the low-resistance region 25 is formed a well region 26, which is identical with the well region 6 in the semiconductor device 1. The well region 26 and the silicon substrate 22 together constitute a protection diode $D_{P2}$, which is identical with the protection diode $D_{P1}$ in the semiconductor device 1. On the silicon substrate 22, P⁻-type regions 32 and 33 are formed, respectively, between the active region 24 and the well region 26 and on the outside periphery of the well region 26.

A continuous source electrode (not shown) is formed on the N-type region 28, the low-resistance region 25, and the well region 26. The source electrode is electrically connected to the N-type region 28, the low-resistance region 25, and the well region 26. The respective MOS FETs 23, the field clamp diode $D_{F2}$, and the protection diode $D_{P2}$ are thus electrically connected in parallel. Between the silicon substrate 22 and the unillustrated source electrode, the resistance of the low-resistance region 25 is lower than the resistance of an electrical conduction path via the MOS FETs 23 and the resistance of the well region 26. The electrical conduction path via the MOS FETs 23 referred to herein includes an electrical conduction path from the silicon substrate 22 to the source electrode via the P⁻-type region 27 and the N-type region 28, and an electrical conduction path from the silicon substrate 22 to the source electrode via the P⁻-type region 27 and the low-resistance region 25.

The source electrode is electrically isolated from the gate electrodes 30 and the P⁻-type regions 32 and 33 independently by unillustrated silicon oxide layers.

In the semiconductor device 21, for a current to flow between the silicon substrate 22 and the source electrode, a channel is formed in the P⁻-type region 27 at a portion in close proximity to the interface to the oxide film (gate insulation film) formed on the inner surface of each trench 29 by applying a sufficiently large voltage between the silicon substrate 22 and the source electrode while the gate electrode 30 is set at adequate potential.

In a case where a fly-back voltage is applied to the semiconductor device 21, the fly-back voltage is applied, concurrently in the same magnitude, to the MOS FETs 23, the field clamp diode $D_{F2}$, and the protection diode $D_{P2}$, which are connected in parallel. A surge current resulted from the fly-back voltage flows through an electrical conduction path including the low-resistance region 25 (field clamp diode $D_{F2}$) having a lower resistance value. Because the P⁻-type region 27 is electrically connected to the low-resistance region 25 having lower resistance, the surge current will never flow between the silicon substrate 22 and the N-type region 28.

Also, because the low-resistance region 25 is formed continuously to surround the active region 24, the surge current flows across the interface between the low-resistance region 25 and the silicon substrate 22, and flows almost evenly through the entire circumference of the interface. That is to say, because the surge current will not concentrate to flow through a particular region, it is possible to avoid an unwanted event that the MOS FETs 23 (channel-forming regions in the P⁻-type region 27 or the like) or parts in the vicinity of the interface between the low-resistance region 25 and the silicon substrate 22 break due to spot-wise heat generation.

Figure 4:
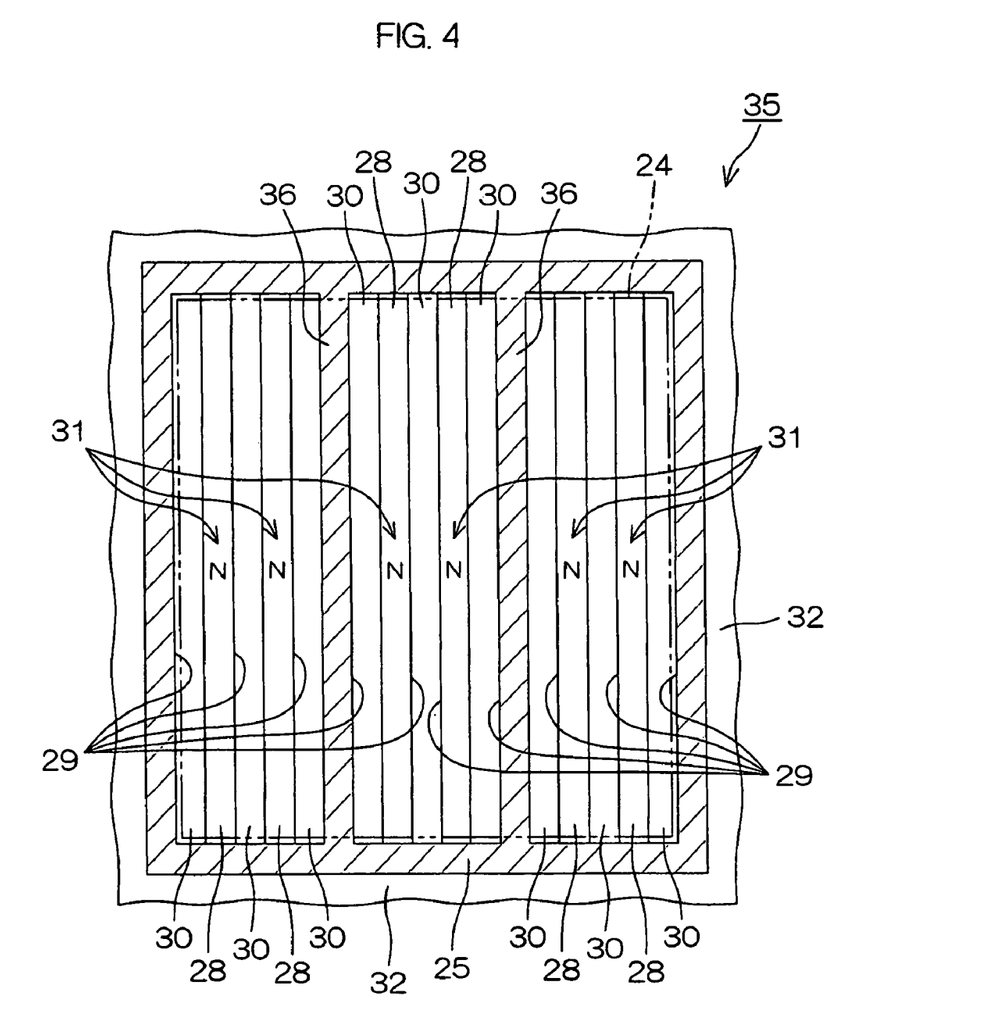
FIG. 4 is a plan view schematically showing the structure of a semiconductor device according a third embodiment of the invention.

FIG. 4 is a plan view schematically showing the structure of a semiconductor device according to a third embodiment of the invention. Referring to FIG. 4, portions corresponding to those shown in FIG. 3 are labeled with like reference numerals with respect to FIG. 3, and the description will be omitted.

A semiconductor device 35 is similar to the semiconductor device 21 shown in FIG. 2 in structure, and an active region 24 is formed on an N⁻-type silicon substrate (drain region) FIG. 4 is a plan view of the silicon substrate, looking down perpendicularly a surface on which the active region 24 is formed. A source electrode and a silicon oxide layer are omitted from FIG. 4.

In the semiconductor device 35, low-resistance regions 36 are formed inside the active region 24 in addition to the low-resistance region 25. The low-resistance regions 36 are formed between two adjacent trenches 29, and extend in a direction parallel to the trenches 29. The low-resistance regions 36 are formed in parallel with a pair of opposing sides of the low-resistance region 25 of a rectangular shape.

The low-resistance regions 36 are connected to the low-resistance region 25 at the both ends in the length direction. That is to say, the low-resistance regions 36 form extensions provided to extend from the low-resistance region 25 into the active region 24.

Because the low-resistance regions (extensions) 36 are formed in parallel with the trenches 29, even when the low-resistance regions 36 are formed in a region shallower than the bottoms of the trenches 29, the low-resistance regions 36 will never be partitioned by the trenches 29. Hence, the low-resistance regions 36 can be brought into contact with the N⁻-type silicon substrate continuously along the length direction.

The low-resistance regions 25 and 36 and the silicon substrate together constitute field clamp diodes, and the field clamp diodes and the MOS FETs formed in the active region 24 are electrically connected in parallel.

One low-resistance region 36 is provided for a specific number of stripe regions 31 (in the case shown in FIG. 4, one for two stripe regions 31). The low-resistance regions 36 are formed at nearly regular intervals, and an interval between two adjacent low-resistance regions 36 is nearly equal to an interval between the low-resistance region 25 in a portion parallel to the low-resistance region 36 and the low-resistance region 36 adjacent to this portion. In short, the low-resistance regions 36 are formed to divide the active region 24 evenly.

In the semiconductor device 35, a surge current resulted from the fly-back voltage flows across not only the interface between the low-resistance region 25 and the silicon substrate, but also the interfaces between the low-resistance regions 36 and the silicon substrate, and flows almost evenly throughout these interfaces. Hence, when compared with the semiconductor device 21 shown in FIG. 3, the current flows while being dispersed further, and breaking hardly occurs in the MOS FETs or in parts in the vicinity of the interfaces between the low-resistance regions 25 and 36 and the silicon substrate.

When a ratio (area ratio) of the low-resistance regions 36 with respect to the stripe regions 31 is high, the number of MOS FETs per unit area within the active region 24 is reduced, which in turn increases the ON-resistance. Hence, it is possible to set an optimum ratio of the low-resistance regions 36 with respect to the stripe regions 31 in view of the ON-resistance and the breaking withstand capability. For instance, one low-resistance region 36 may be provided for 20 stripe regions 31.

Figure 5A:
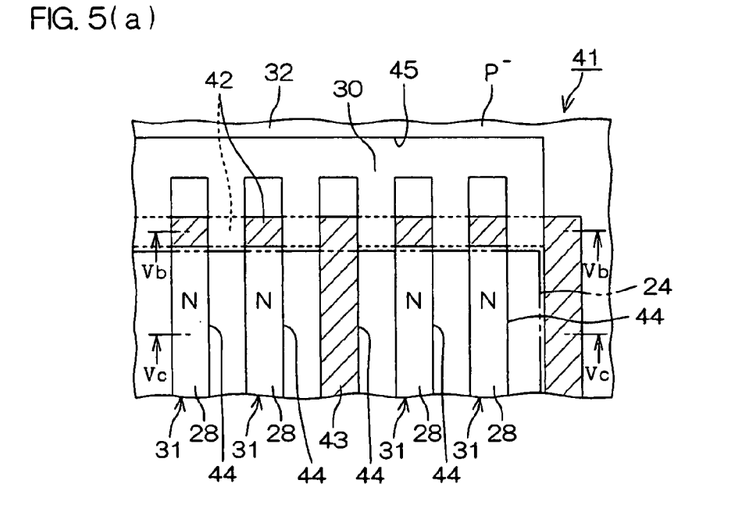
FIG. 5(a) is a plan view schematically showing the structure of a semiconductor device according a fourth embodiment of the invention.
Figure 5B:
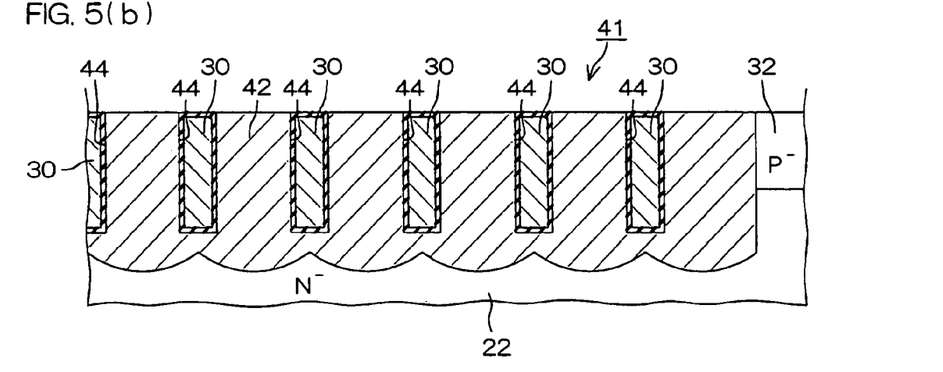
FIG. 5(b) and FIG. 5(c) are cross sections schematically showing the structure of the semiconductor device according to the fourth embodiment of the invention.
Figure 5C:
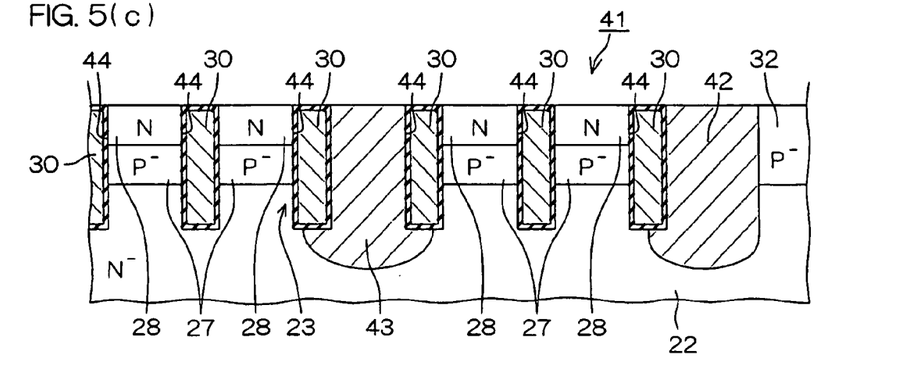

FIG. 5(a) is a plan view schematically showing the structure of a semiconductor device according to a fourth embodiment of the invention. FIG. 5(b) is a cross-section taken along a cutting line Vb-Vb shown in FIG. 5(a). FIG. 5(c) is a cross section taken along a cutting line Vc-Vc shown in FIG. 5(a). Referring to FIG. 5(a) through FIG. 5(c), portions corresponding to those shown in FIG. 4 are labeled with like reference numerals with respect to FIG. 4, and the description will be omitted.

A semiconductor device 41 is similar to the semiconductor device 35 shown in FIG. 4 in structure, and a low-resistance region 42 equivalent to the low-resistance region 25 is formed on the outermost periphery of the active region 24. Also, low-resistance regions 43 equivalent to the low-resistance regions 36 are formed within the active region 24. Referring to FIG. 5(a) through FIG. 5(c), of the semiconductor portions, the low-resistance regions 42 and 43 alone are indicated by hatching.

A trench 45 is formed to extend perpendicularly to trenches 44 on the outside of the low-resistance region 42 at a portion perpendicular to the length direction of the trenches 44. The trenches 44 extend to cross the low-resistance region 42 and communicate with the trench 45.

The low-resistance regions 42 and 43 are formed into a region deeper than the bottoms of the trenches 44 (see FIG. 5(b) and FIG. 5(c)). The low-resistance region 42 is partitioned by the trenches 44 in a shallow region from the surface, but is continuous underneath by underlying the trenches 44 (see FIG. 5(b)).

A P⁻-type region 32 is formed on the outside of the low-resistance region 42 and the trench 45, and a well region (not shown), which is identical with the well region 26 in the semiconductor device 21, is formed further on the outside (periphery) of the P⁻-type region 32.

In the semiconductor device 41 configured as described above, as with the semiconductor device 35, a current flows almost evenly through the interfaces between the low-resistance regions 42 and 43 and the silicon substrate 22. Hence, breaking hardly occurs in the MOS FETs 23 or in parts in the vicinity of the interfaces between the low-resistance regions 42 and 43 and the silicon substrate 22.

While the embodiments of the invention have been described, the invention can be embodied otherwise. For instance, in any of the second through fourth embodiments, base regions doped with impurities at a high concentration used to form a path for a surge current resulted from a fly-back voltage to flow are not formed within the stripe regions 31. However, such base regions may be formed within the stripe regions 31.

In this case, for example, base regions, which are identical with the base regions 68 in the semiconductor device 61 shown in FIG. 7, are assumed to be formed within the stripe regions 31. The base regions in this case can be connected to the low-resistance region 25 or 42 provided on the outermost periphery of the active region 24, either directly or via the P⁻-type region 27.

The function elements formed in the semiconductor device (active region) may be IGBTs (Insulated Gate Bipolar Transistors) instead of MOS FETs.

In the semiconductor devices 1, 21, 35, and 41 in the embodiments described above, the function elements (MOS FETs) are of a trench structure such that allows a current to flow in the depth direction of the trenches (a direction perpendicular to the silicon substrate 2 or 22); however, they may be of a planar structure such that allows a current to flow in a direction parallel to the silicon substrate 2 or 22.

While the embodiments of the invention have been described in detail, it should be appreciated that these embodiments represent examples to provide clear understanding of the technical contents of the invention, and the invention is not limited to these examples. The sprit and the scope of the invention, therefore, are limited solely by the scope of the appended claims.

This application is based upon the prior Japanese Patent Application No. 2003-415329 filed with the Japanese Paten Office on Dec. 12, 2003, the entire contents of which are incorporated herein by reference.

What is claimed is:

1. A semiconductor device, comprising:
   a semiconductor substrate of a first conduction type;
   an active region used as a function-element-forming region on the semiconductor substrate;
   a low-resistance region of a second conduction type formed on an outermost periphery of the active region to surround the active region and having contact with the semiconductor substrate, the second conduction type being different from the first conduction type; and
   an electrode connected to the function element and the low-resistance region,
   wherein:
   a diode is formed by the semiconductor substrate and the low-resistance region;
   the function element and the diode are electrically connected in parallel between the semiconductor substrate and the electrode; and
   between the semiconductor substrate and the electrode, resistance of the low-resistance region is lower than resistance of an electrical conduction path via the function element;
   wherein the low-resistance region includes an extension provided to extend into the active region.

2. A semiconductor device according to claim 1, wherein the extension of the low-resistance region is formed substantially parallel to a trench formed in the active region.

3. A semiconductor device according to claim 1, wherein the low-resistance region includes more than one of the extension, and the plurality of extensions are formed at substantially regular intervals.

4. A semiconductor device, comprising:
   a semiconductor substrate of a first conduction type;
   an active region used as a function-element-forming region on the semiconductor substrate;
   a low-resistance region of a second conduction type formed on an outermost periphery of the active region to surround the active region and having contact with the semiconductor substrate, the second conduction type being different from the first conduction type; and
   an electrode connected to the function element and the low-resistance region, wherein:
a diode is formed by the semiconductor substrate and the low-resistance region;
the function element and the diode are electrically connected in parallel between the semiconductor substrate and the electrode; and
between the semiconductor substrate and the electrode, resistance of the low-resistance region is lower than resistance of an electrical conduction path via the function element;

wherein the function element is one of a MOS field effect transistor and an insulated gate bipolar transistor;
wherein in one of the MOS field effect transistor and the insulated gate bipolar transistor, a channel-forming region is of the second conduction type, and the channel-forming region is electrically connected to the low-resistance region.

* * * * *